(12) United States Patent
Rai et al.

(10) Patent No.: US 12,706,577 B2
(45) Date of Patent: Aug. 11, 2026

(54) AMPLIFIER WITH MULTIPLE, DIFFERENTIAL INPUT PAIRS

(71) Applicant: TEXAS INSTRUMENTS INCORPORATED, Dallas, TX (US)

(72) Inventors: Saurabh Rai, Bengaluru (IN); Ramakrishna Ankamreddi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 701 days.

(21) Appl. No.: 17/828,793

(22) Filed: May 31, 2022

(65) Prior Publication Data

US 2022/0399862 A1 Dec. 15, 2022

(30) Foreign Application Priority Data

Jun. 10, 2021 (IN) ............................ 202141025783

(51) Int. Cl.
*H03F 3/45* (2006.01)
*G05F 3/26* (2006.01)

(52) U.S. Cl.
CPC ......... *H03F 3/45192* (2013.01); *G05F 3/267* (2013.01); *H03F 3/45085* (2013.01); *H03F 2200/84* (2013.01)

(58) Field of Classification Search
CPC ............ H03F 3/45192; H03F 3/45085; H03F 2200/84; H03F 2203/45186; G05F 3/267
USPC ........................................................ 330/253
See application file for complete search history.

(56) References Cited

U.S. PATENT DOCUMENTS 7,375,585 B2 * 5/2008 Trifonov ............ H03F 3/45219 330/258
2019/0140607 A1 * 5/2019 Otani ................. H03F 3/45183

* cited by examiner

*Primary Examiner* — Andrea Lindgren Baltzell
*Assistant Examiner* — Khiem D Nguyen
(74) *Attorney, Agent, or Firm* — Charles F. Koch

(57) ABSTRACT

An amplifier includes a first differential input pair of transistors having a first input terminal, a second input terminal, a first output terminal, and a second output terminal. A second differential input pair of transistors has a third input terminal, a fourth input terminal, a third output terminal, and a fourth output terminal. The first input terminal is coupled to the third input terminal, the second input terminal is coupled to the fourth input terminal, the first output terminal is coupled to the third output terminal, and the second output terminal is coupled to the fourth output terminal. A cross-over circuit has a control input coupled to the second fourth input terminals. The cross-over circuit is configured to vary an amount of bias current through the second differential input pair of transistors based on a magnitude of a voltage on the second and fourth input terminals.

25 Claims, 5 Drawing Sheets

CLAMP
IBIAS2
NAT_VT
Q_BIAS
Q_CLAMP
(M/2)*X
IBIAS3
R_BIAS
ICLAMP
320
Vdd
110
IBIAS4
203
IP
VREF
MPI1
MPI2
VOUT
MPI3
MN3
RB1
RB2
MNP1
MNP2
RT1
RT2
VO1
VO2
EAMPHZ
SECOND STAGE
220
IP
VREF
Q1
Q2
VOUT
M*X
M*X
201
VBIAS
MNBIAS1
2*M*X
TO FIG. 3B

AMPLIFIER WITH MULTIPLE, DIFFERENTIAL INPUT PAIRS

CROSS-REFERENCE TO RELATED APPLICATIONS

This application claims priority to India Provisional Application No. 202141025783, filed Jun. 10, 2021, which is hereby incorporated by reference.

BACKGROUND

Amplifiers are used in a variety of applications. For example, a low-drop out (LDO) voltage regulator may use an amplifier as an error amplifier to help regulate the magnitude of the output voltage. In that context, the error amplifier amplifies the difference between the output voltage (or a voltage derived from the output voltage such as through a voltage divider) and a reference voltage. The output signal from the error amplifier is an error signal that can be used to control the gate-to source voltage of a transistor (also called a pass-field effect transistor, "pass-FET") to vary the current to the load powered by the LDO regulator.

SUMMARY

In one example, an amplifier includes a first differential input pair of transistors having a first input terminal, a second input terminal, a first output terminal, and a second output terminal. A second differential input pair of transistors has a third input terminal, a fourth input terminal, a third output terminal, and a fourth output terminal. The first input terminal is coupled to the third input terminal, the second input terminal is coupled to the fourth input terminal, the first output terminal is coupled to the third output terminal, and the second output terminal is coupled to the fourth output terminal. A cross-over circuit has a control input coupled to the second fourth input terminals. The cross-over circuit is configured to vary an amount of bias current through the second differential input pair of transistors based on a magnitude of a voltage on the second and fourth input terminals.

DETAILED DESCRIPTION

Figure 1:
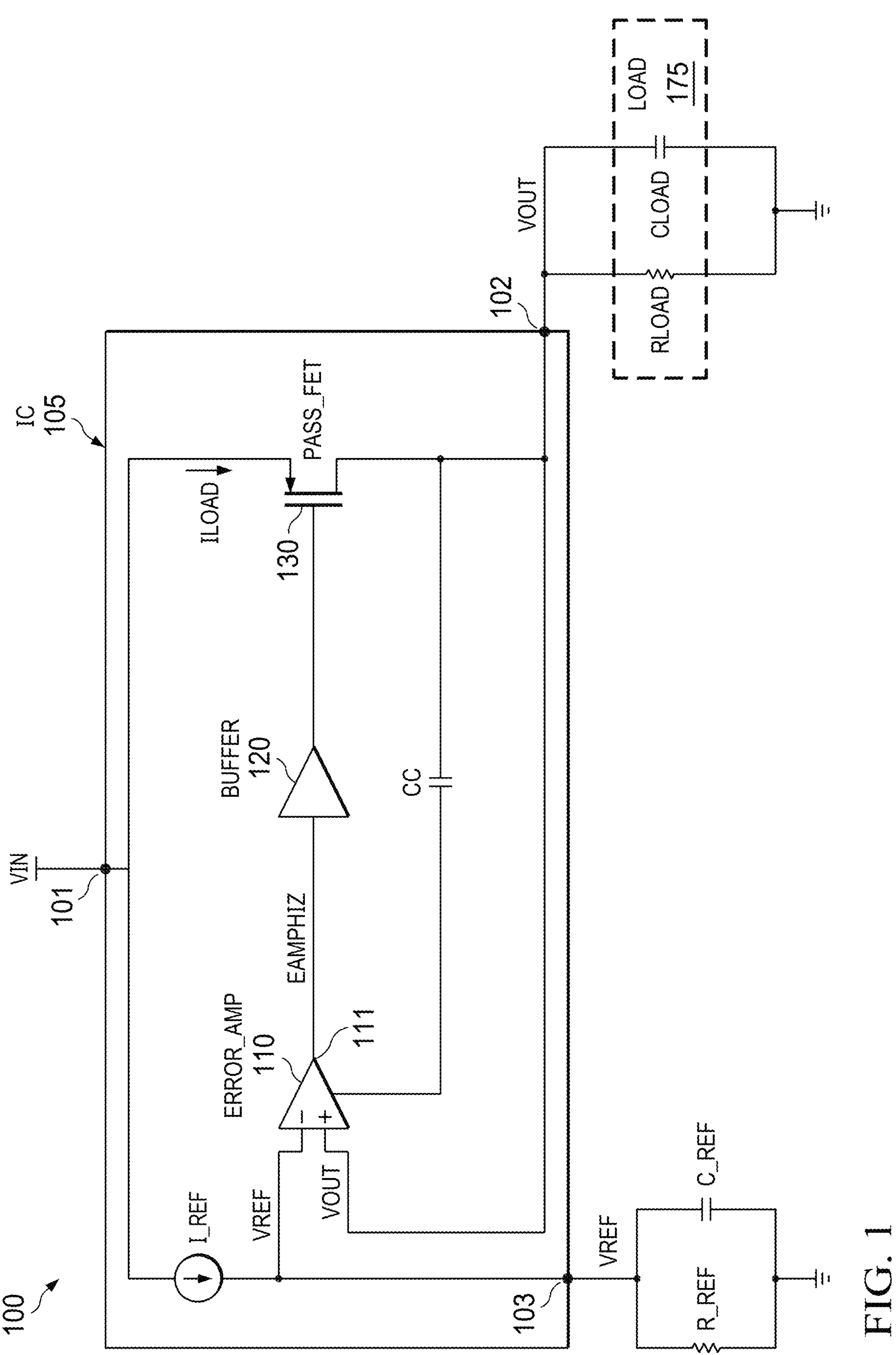
FIG. 1 is a schematic of a voltage regulator including an error amplifier, in accordance with a described example.

For some amplifier applications, the noise on the output of the amplifier should be reduced as much as possible. An amplifier that implements a unity feedback architecture is advantageous in low noise applications. Further, some LDO voltage regulators should have an output voltage range that is near rail-to-rail operation. In one example, the regulator should be able to produce an output voltage in the range of 0.4 V to 200 mV below its input voltage.

The amplifier described herein includes multiple differential input pairs of transistors, which are selectively used depending on the magnitude of the output voltage. In one example, the amplifier includes three differential input pairs of transistors including a pair of p-channel field effect transistors (PFETs), a pair of n-channel field effect transistors (NFETs), and a pair of NPN bipolar junction transistors (BJTs). Output terminals of each of the three input transistor pairs are coupled together thereby providing a single pair of output terminals to a second stage of the amplifier. In one embodiment, the PFET pair is used at start-up of the supply voltage, VIN, to the amplifier (e.g., when the output voltage of the amplifier, VOUT, is between, for example, 0 V and 0.4 V). The NFET pair may include "natural" NFETs which have low threshold voltages and thus can be turned on with a relatively low gate-to-source voltage (Vgs) (e.g., 100 mV). A natural transistor (sometimes referred to as "native" transistors) may be fabricated on slightly p-doped silicon that forms the bulk region. The NFET pair is used for a VOUT between, for example, 0.4 V and 0.8V. The NPN BJT pair is used for a VOUT greater than, for example, 1.2V. In the range of VOUT between 0.8 V and 1.2 V, bias current flows through both the NFET and the NPN BJT pairs although the bias current through the NFET pair varies inversely with VOUT (as VOUT increases, the bias current through NFET pair decreases). The described amplifier includes a cross-over circuit configured to control the use of the various differential input pairs of transistors based on the magnitude of VOUT.

The voltage regulator described herein is capable of a wide range of VOUT and takes advantage of the noise characteristics of the input transistor pairs. At low levels of VOUT, the PFET pair is used (e.g., at start-up of the amplifier). At higher levels of VOUT (e.g., VOUT greater than 1.2 V, the NPN BJT pair is activated. The NPN BJT pair introduces substantially less noise than either the PFET or the natural NFET pair. However, the NPN BJT pair will not have sufficient headroom (e.g., a sufficient base-to-emitter voltage, 'Vbe') unless VOUT (which is coupled to the base of one of transistors of the NPN BJT pair) is greater than approximately 0.8V. The natural NFET pair can be turned on at lower levels of VOUT than the NPN BJT pair, and is used for a VOUT in the range of, for example, 0.4 V to 0.8 V. The natural NFET pair introduces more noise into VOUT than the NPN BJT pair (and less noise than the PFET pair) but the natural NFET pair can be used at lower levels of VOUT than the NPN BJT pair.

FIG. 1 shows an example of a voltage regulator 100. The voltage regulator 100 in this example is an LDO voltage regulator and includes an amplifier 110, a buffer 120, a transistor 130, a compensation capacitor CC, a resistor R_REF, a capacitor C_REF, and a current source circuit I_REF. In the embodiment shown in FIG. 1, the amplifier 110, the buffer 120, the transistor 130, the compensation capacitor CC, and the current source circuit I_REF are fabricated as part of a single integrated circuit (IC) 105, and the resistor R_REF and capacitor C_REF are components that are external to the IC 105.

The IC 105 includes terminals 101, 102, and 103. An input voltage (VIN) is coupled to terminal 101. The output voltage (VOUT) is provided on terminal 102. The resistor R_REF and capacitor C_REF are coupled in parallel between terminal 103 and ground. The current source circuit I_REF produces a current I_REF ("I_REF" refers both to the current source circuit and the magnitude of the current it produces) which flows into the parallel combination of resistor R_REF and capacitor C_REF to produce a reference voltage, V_REF. The combination of the resistor R_REF and capacitor C_REF is a low-pass filter to reduce the amount of noise on VREF.

The amplifier 110 includes a non-inverting (positive, '+') input, an inverting (negative, '−') input, and an amplifier output 111. The inverting input is coupled to VREF, and the non-inverting is coupled to VOUT. The amplifier 110 amplifies the difference between VOUT and VREF to produce an output signal EAMPHIZ. The amplifier's output signal EAMPHIZ is provided to an input of buffer 120, and the output of buffer 120 is coupled to the control input of transistor 130. In the example of FIG. 1, transistor 130 is a p-channel field effect transistor (PFET) and is also referred to as a "PASS_FET."

Via buffer 120, the output signal EAMPHIZ from the amplifier 110 controls the gate of PASS_FET 130. The source of PASS_FET 130 is coupled to terminal 101 and thus receives the input voltage, VIN. The drain of PASS_FET 130 is coupled to terminal 102. The voltage on the drain of PASS_FET 130 provides the output voltage, VOUT. Compensation capacitor CC is coupled between VOUT and an internal node within amplifier 110.

The load 175 is modeled as a parallel combination of a load resistance, RLOAD, and a load capacitance, CLOAD. Current ILOAD flows through the PASS_FET 130 to the load 175. The magnitude of the load current ILOAD is controlled by the source-to-gate voltage (Vgs) on the PASS_FET. The voltage on the source of the PASS_FET 130 is VIN and thus the amplifier's output signal EAMPHIZ, which is provided to the gate of the PASS_FET controls the Vsg of the PASS_FET.

The voltage regulator 100 implements a control loop which includes the amplifier 110. Nominally, VOUT should be approximately equal to VREF. If VOUT exceeds VREF, the magnitude of EAMPHIZ increases. Responsive to an increase in EAMPHIZ, the Vsg of the PASS_FET 130 decreases which causes a decrease in the load current ILOAD. A decrease in ILOAD causes VOUT to decrease. Similarly, If VOUT falls below VREF, the magnitude of EAMPHIZ decreases. Responsive to a decrease in EAMPHIZ, the Vsg of the PASS_FET 130 increases which causes an increase in the load current ILOAD. An increase in ILOAD causes VOUT to increase. The amplifier 110 is also referred to as an "error amplifier" in that its output signal EAMPHIZ represents the error between VOUT and VREF.

Figure 2:
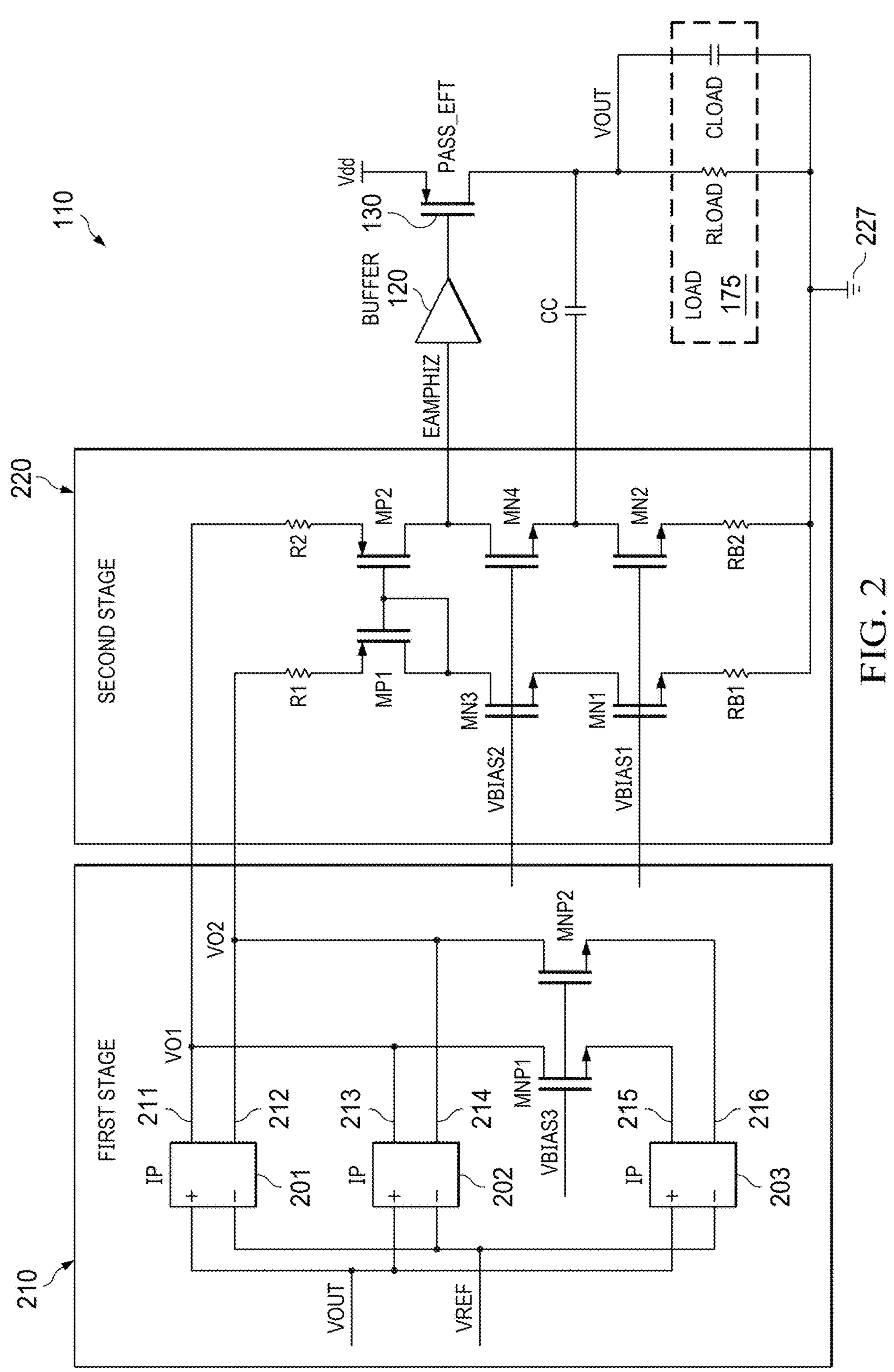
FIG. 2 is a schematic of an example implementation of the error amplifier of FIG. 1, in accordance with an example.

FIG. 2 is a schematic illustrating one possible implementation of amplifier 110. In this example, amplifier 110 includes a first stage 210 coupled to a second stage 220. The first stage 210 includes multiple differential input pairs of transistors (referred to herein as "input pairs" for shorthand simplicity) 201, 202, and 203. In one example, input pair 201 includes NPN BJT transistors, input pair 202 includes natural NFETs, and input pair 203 includes PFETs. Each input pair 201-203 includes a non-inverting input coupled together and to VOUT. Each input pair also includes an inverting input coupled together and to VREF.

The input pair 201 includes differential outputs 211 and 212. The input pair 202 includes differential outputs 213 and 214. The input pair 203 includes differential outputs 215 and 216. Corresponding outputs 211, 213, and 215 are coupled together at a common first stage output node VO1 (with output 215 coupled to VO1 via NFET MNP1). Similarly, corresponding outputs 212, 214, and 216 are coupled together at a common first stage output node VO2 (with output 216 coupled to VO2 via NFET MNP2). Current from any of the input pairs 201-203 is provided to the second stage 220 through the same output nodes VO1 and VO2.

The second stage 220 includes resistors R1 and R2. Output node VO1 is coupled to resistor R2, and output node VO2 is coupled to resistor R1. The second stage 220 also includes PFETs MP1 and MP2, NFETs MN1, MN2, MN3, and MN4, and resistors RB1 and RB2, and is configured as a folded-cascode architecture. Resistor R1 is coupled to the source of transistor MP1 and resistor R2 is coupled to the source of transistor MP2. The drains of transistors MP1 and MN3 are coupled together and to the gate of transistor MP1. The drains of transistors MP2 and MN4 are coupled together. Transistor MN1 is coupled between the source of transistor MN3 and resistor RB1. Transistor MN2 is coupled between the source of transistor MN4 and resistor RB2. The gates of transistors MN1 and MN2 are coupled to a bias voltage VBIAS1, and the gates of transistors MN3 and MN4 are coupled to a bias voltage VBIAS2. The voltage on the drains of transistors MP2 and MN4 (signal EAMPHIZ) is the single-ended output voltage (referenced to ground 227) and is coupled to the input of buffer 120. The compensation capacitor CC is coupled between VOUT and the drain of transistor MN2 (and source of transistor MN4).

Figure 3A:
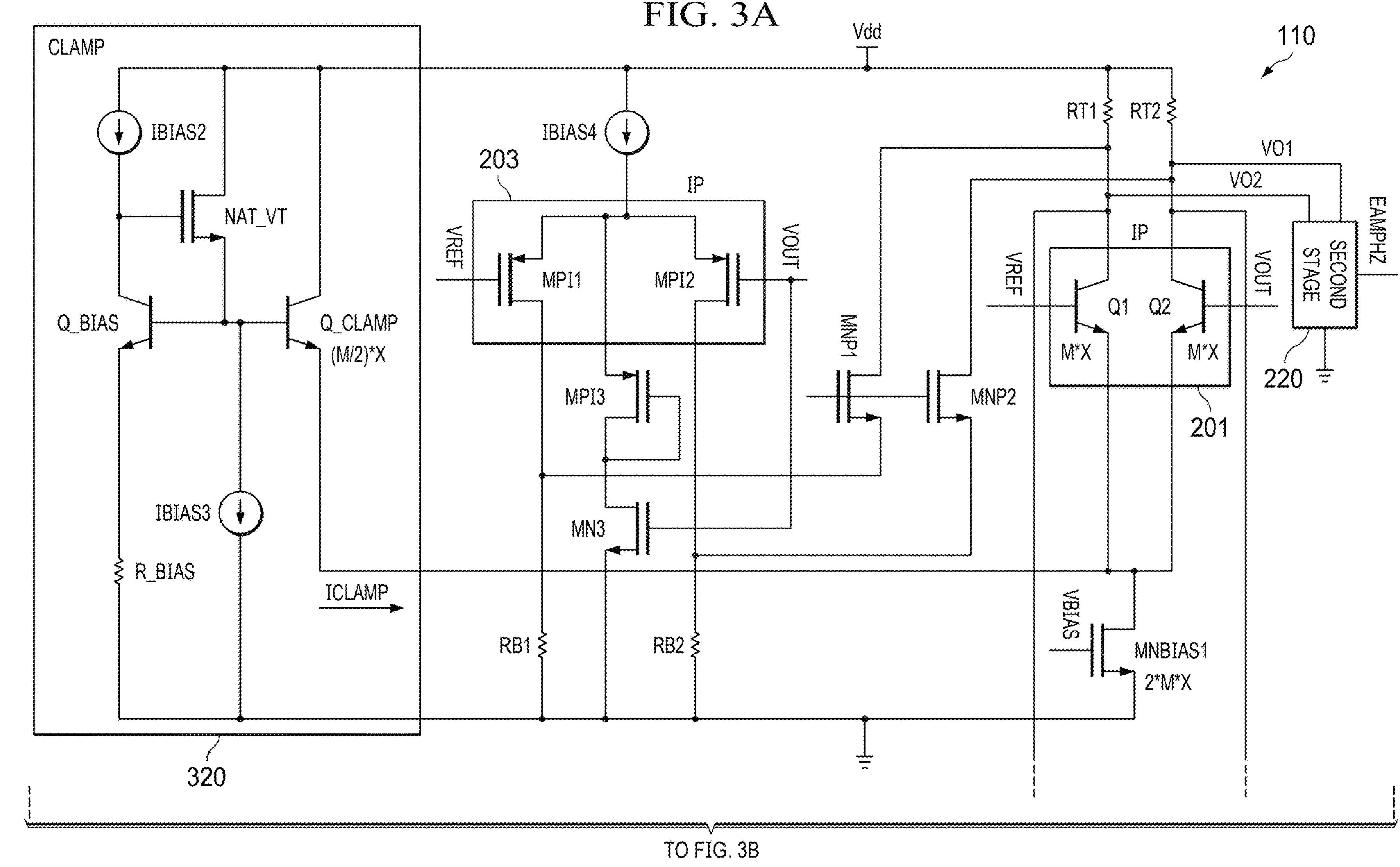
FIGS. 3A and 3B (collectively, "FIG. 3") include a schematic illustrating additional detail of the error amplifier of FIG. 1.
Figure 3B:
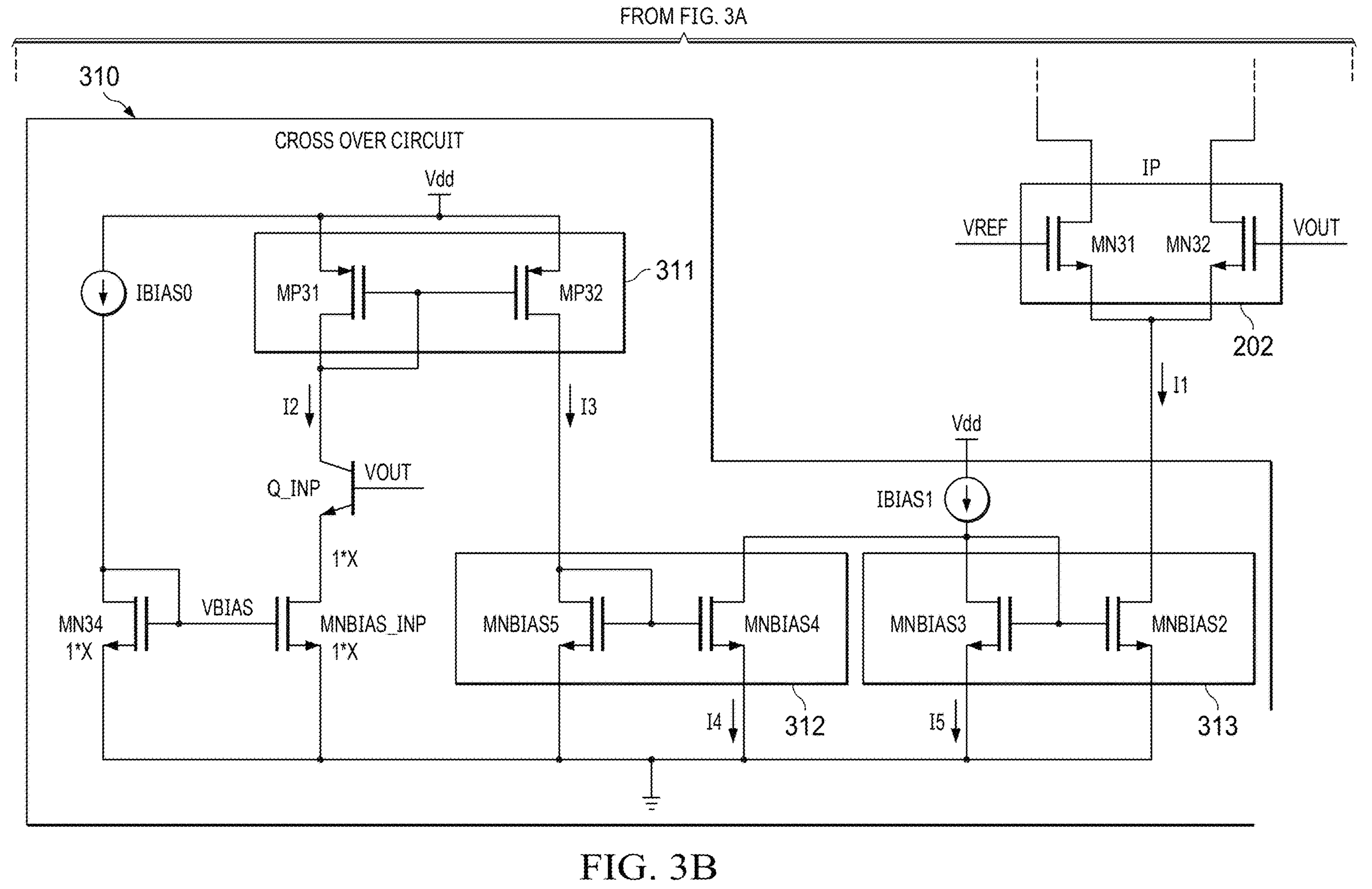

FIG. 3 is a schematic of amplifier 110 with additional detail compared to FIG. 2. In the example of FIG. 3, amplifier 110 includes input pairs 201, 202, and 203, crossover circuit 310, a clamp circuit 320, and the second stage 220. The input pair 201 includes NPN transistors Q1 and Q2. The base of transistor Q1 is coupled to VREF, and the base of transistor Q2 is coupled to VOUT. The emitters of transistors Q1 and Q2 are coupled together and to the drain of MNFET MNBIAS1. The source of MNBIAS1 is coupled to ground. Transistor MNBIAS1 provides the bias current through transistors Q1 and Q2. The voltage on the gate of transistor MNBIAS1 is 'VBIAS1,' which is generated by the clamp circuit 320, described below.

Resistor RT1 is coupled between VIN and the collector of transistor Q1 at node VO2. Resistor RT2 is coupled between VIN and the collector of transistor Q2 at node VO1. With respect to input pair 201, when the Vbe of transistors Q1 and Q2 is large enough to turn on those transistors, that portion of the bias current that flows through transistor Q1 also flows through resistor RT1, and that portion of the bias current that flows through transistor Q2 also flows through resistor RT2. A voltage develops across resistor RT1 that is function of the current through transistor Q1. A voltage also develops across resistor RT2 that is function of the current through transistor Q2. Output nodes VO1 and VO2 are coupled to the second stage 220.

The input pair 202 includes natural NFETs MN31 and MN32. Natural NFETs have a relatively low threshold voltage (e.g., 100 mV). Other NFETs that also have a relatively threshold voltage also can be used. The drains of natural NFETs MN31 and MN32 couple to the same output nodes VO1 and VO2 as the transistors of the input pair 201. The gate of natural NFET MN31 is couple to VREF, and the gate of natural NFET MN32 is coupled to VOUT. Any current that flows through natural NFET MN31 also flows through resistor RT1, and any current that flows through natural NFET MN32 also flows through resistor RT2.

Input pair 203 includes PFETs MPI1 and MPI2. A current source circuit IBIAS4 supplies the bias current to the input pair 203. At low levels of VOUT and VREF, transistors MPI1 and MPI2 are on and transistor MN3 (an NFET) is off. As VOUT increases, eventually transistor MN3 turns on. The current path through transistor MPI3 and MN3 is a lower impedance path than through transistors MPI1 and MPI2, and thus current ceases through transistors MPI1 and MPI2. While transistors MPI1 and MPI2 are on, their drain current flows through corresponding resistors RB1 and RB2, which are coupled to output nodes VO1 and VO2 via transistors MNP1 and MNP2, as described above.

The voltages on output nodes VO1 and VO2 are thus a function of either (a) the current through the input pair 203 when only the input pair 203 is on and conducting current, (b) the current through input pair 202 when only input pair 202 is on and conducting current, (c) the current through input pair 201 when only input pair 201 is on and conducting current, or (d) the current through input pairs 201 and 202 when both input pairs 201 and 202 are on and conducting current.

At start-up of the amplifier 110 (VIN turns on and begins to ramp up towards its steady state level), VOUT is too low for the transistors of input pairs 201 and 202 to be on. The transistors MPI1 and MPI2 of input pair 203 are on.

Responsive to VOUT reaching 0.4 V, input pair 201 turns off, and transistors MN31 and MN32 of input pair 202 turn on. With VOUT in the range of 0.4 V to 0.8 V, input pair 202 is on, but VOUT is too small for input pair 201 to be on. Accordingly, with VOUT between 0.4 V and 0.8 V, input pair 202 is on and input pairs 201 and 203 are off.

If VOUT is between 0.8 V and 1.2 V, to varying degrees both input pairs 201 and 202 are on. Within this range of VOUT, at higher levels of VOUT, the bias current I1 for the input pair 202 decreases. When VOUT reaches approximately 1.2 V, the bias current I1 for input pair 202 becomes 0 A thereby fully shutting of input pair 202 in favor of input pair 201 being used. The cross-over circuit 310 (described below) accomplishes the functionality of gradually shutting off input pair 202 as VOUT increases during the transition region for VOUT between 0.8 V and 1.2 V.

Referring still to FIG. 3, the cross-over circuit 310 includes current mirrors 311, 312, and 313, transistors Q_INP (NPN), MNBIAS_INP (NFET), and MN34 (NFET), and current source circuits IBIAS0 and IBIAS1. Transistors MN34 and MNBIAS_INP are configured as a current mirror as well. Current IBIAS0 flows through transistor MN34. Current mirror 311 includes PFET transistors MP31 and MP32 (sources connected together, and gates connected together and to the drain of MP31). Current mirror 312 includes NFET transistors MNBIAS5 and MNBIAS4 (sources connected together, and gates connected together and to the drain of MNBIAS5). Current mirror 313 includes NFET transistors MNBIAS3 and MNBIAS2 (sources connected together, and gates connected together and to the drain of MNBIAS3). Current source circuit IBIAS1 supplies a current (IBIAS1) that divides between transistors MNBIAS4 and MNBIAS3). The drain of transistor MP31 is coupled to the collector NPN BJT Q_INP. The collector of NPN BJT Q_INP is coupled to the drain of transistor MNBIAS_INP, and the base of Q_INP is coupled to Vout. The sources of transistors MNBIAS_INP, MNBIAS5, MNBIAS4, MNBIAS3, and MNBIAS2 are coupled to ground.

FIG. 3 also lists the relative sizes of various of the transistors in accordance with an example. The size of NFET MNBIAS1 is 2*M*X, whereas the size of NFET MNBIAS_INP is 1*X, which thus is 2*M times smaller than MNBIAS1. The magnitude of current I2 flowing through transistor MNBIAS_INP results in a corresponding gate voltage (VBIAS), which also is coupled to the gate of transistor MNBIAS1. The size of MNBIAS_INP is 1*X, whereas the size of MNBIAS12*M*X, which thus is 2*M times larger than MNBIAS1. The size of NPN BJTs Q1 and Q2 are M*X, and the size of NPN BJT Q_INP is 1*X. These relative sizes ensure that the current density of transistors Q_INP, Q1, Q2, and MNBIAS1 are all the same, which ensues a seamless cross-over from the use of one input pair to the next.

For larger levels of VOUT, the Vbe of NPN BJT Q_INP is larger thereby causing current I2 through transistor Q_INP (and thus through transistor MP31) to increase. At the same time, VBIAS increases due to the increase in current I2, and thus the gate voltage of transistor MNBIAS1 increases. Current I2 is mirrored as current I3 through transistor MP32. Accordingly, as VOUT increases, current I3 increases. Current I3 is mirrored as current I4 through transistor MNBIAS4. Bias current IBIAS1 divides between currents I4 and I5. As current I4 increases (with increasing VOUT), current I5 decreases to maintain balance with current IBIAS1. Current I5 is mirrored as the bias current I1 for the natural NFET transistors MN31 and MN32 of input pair 202. Accordingly, as VOUT increase, the bias current I1 for the input pair 202 decreases. As a result of the sizing ratios selected for the various transistors, as described above, I1 decreases by the same percentage that the bias current through Q1 and Q2 increases. Eventually, at a VOUT voltage of approximately 1.2 V, the bias current I1 for the input pair 202 falls to 0 A and the input pair 202 shuts off.

At low enough voltage levels of VOUT that the NPN BJT input pair 201 is not on, absent the use of the clamp circuit 320, the bias transistor MNBIAS1 for the input pair 201 may operate in the triode region which causes a common node signal to be introduced on nodes VO1 and VO2. Accordingly, the common mode rejection ratio (CMRR) of the amplifier is reduced. To avoid this problem and increase the CMRR of the amplifier, the clamp circuit 320 ensures that transistor MNBIAS1 is operated in the saturation region when transistors Q1 and Q2 of input pair 201 are otherwise off.

The clamp circuit 320 includes current source circuits IBIAS2 and IBIAS3, a resistor R_BIAS, a natural NFET NAT_VT, and NPN BJTs Q_BIAS and Q_CLAMP. The bias current from current source circuit IBIAS2 causes a voltage to form across resistor R_BIAS. The voltage of the base of Q_BIAS and Q_CLAMP is 1*Vbe above the voltage across resistor R_BIAS. The voltage on the emitter of transistor Q_CLAMP is 1*Vbe below the base voltage, and thus approximately equal to the voltage across resistor R_BIAS.

The clamp circuit 320 ensures that transistor MNBIAS1 operates in the saturation region when input pair 201 is off. Current through NPN BJT Q_CLAMP provides the current to transistor MNBIAS1 until VOUT is large enough to turn on input pair 201. Transistors Q1 and Q2 of input pair 201 are larger than transistor Q_CLAMP. In the example of FIG. 3, the size of transistors Q1 and Q2 is M*X, whereas the size of transistor Q_CLAMP is (M/2)*X, which is half the size of transistors Q1 and Q2. When VOUT is equal to VREF (which the control loop described above attempts to ensure), one-half of the bias current of transistor MNBIAS1 flows through each of transistors Q1 and Q2 when input pair 201 is on. Accordingly, each of transistors Q1 and Q2 are twice the size as transistor Q_CLAMP, and each transistor Q1 and Q2 has half the current flowing through it compared to transistor Q_CLAMP when the input pair 201 is off. With input pair 201 on, the current path through transistors Q1 and Q2 is a much lower resistance path than through transistor Q_CLAMP and thus, responsive to transistors Q1 and Q2 turning on, the current from transistor Q_CLAMP (current ICLAMP) decreases to 0 A.

Figure 4:
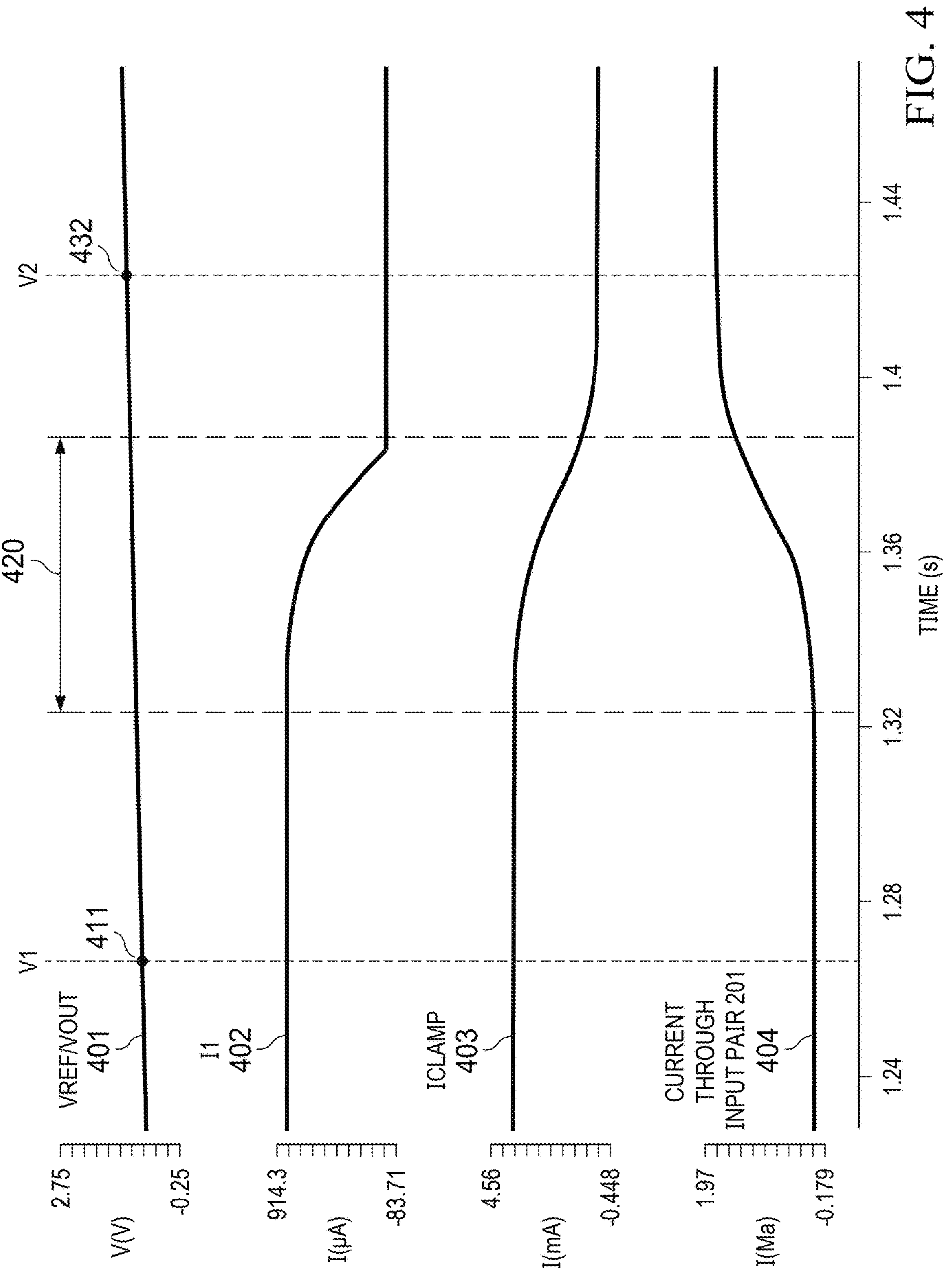
FIG. 4 are waveforms illustrating the operation of the error amplifier of FIG. 3.

FIG. 4 shows example waveforms 401, 402, 403, and 404. The X-axis is time and the Y-axis is voltage or current depending on the particular waveform. Waveform 401 represents VREF or VOUT. As described above, the control loop forces VOUT to be approximately equal to VREF. VREF is shown increasing linearly over time so that the corresponding transient response can be shown for current I1 (waveform 402), which is bias current through input pair 202, ICLAMP (waveform 403), and the combined current through the transistors Q1 and Q2 of input pair 201 (waveform 404).

At point 411, VOUT (or VREF) is approximately 666 mV. At this level of VOUT, input pair 202 is on and input pair 201 is off. Accordingly, current I1 is larger (e.g., 828 μA) than the combined current through input pair 201 (e.g., 86 nA). The clamp circuit 320 ensures transistor MNBIAS1 is operating in the saturation region, and ICLAMP current (waveform 403) supplies the current to transistor MNBIAS1.

The transition described above from the input pair 202 being on to input pair 201 being on is shown at 420. As VOUT increases during this range, I1 begins to decrease as the cross-over circuit 310 causes the bias current (I1) to decrease as described above. The combined current through the input pair 201 begins to increase as shown, and eventually VOUT is large enough that I1 reduces to approximately 0 A and input pair 202 is shut off. As more and more current flows through input pair, ICLAMP decreases. Reference numeral 432 identifies a VOUT of approximately 1.05 V. At this level of VOUT, I1 is 5.5 nA and the combined current of input pair 201 is 1.77 mA.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-channel field effect transistor ("PFET") may be used in place of an n-channel field effect transistor (NFET) with little or no changes to the circuit. Furthermore, other types of transistors may be used (such as bipolar junction transistors (BJTs)). A transistor has a control input and pair of current terminals. The control input for a FET is the gate, and the current terminals are the drain and source. The control input for a BJT is the base, and the current terminals are the collector and emitter.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An amplifier, comprising:

a first differential input pair of transistors having a first input terminal, a second input terminal, a first output terminal, and a second output terminal;

a second differential input pair of transistors having a third input terminal, a fourth input terminal, a third output terminal, and a fourth output terminal, the first input terminal coupled to the third input terminal, the second input terminal coupled to the fourth input terminal, the first output terminal directly connected to the third output terminal, and the second output terminal directly connected to the fourth output terminal; and a cross-over circuit having a control input coupled to the second and fourth input terminals, the cross-over circuit capable of varying an amount of bias current through the second differential input pair of transistors based on a magnitude of a voltage on the second and fourth input terminals.

2. The amplifier of claim 1, wherein the first differential input pair of transistors comprises a pair of bipolar junction transistors.

3. The amplifier of claim 2, wherein the second differential input pair of transistors comprises a pair of field effect transistors.

4. The amplifier of claim 3, wherein the pair of field effect transistors are natural field effect transistors.

5. The amplifier of claim 1, wherein:
the first differential input pair of transistors comprises a pair of NPN bipolar junction transistors; and
the second differential input pair of transistors comprises a pair of natural n-channel field effect transistors.

6. The amplifier of claim 5, further comprising a third differential input pair of transistors comprising a pair of p-channel field effect transistors.

7. The amplifier of claim 1, wherein the cross-over circuit includes:
a first transistor having first control input, the first control input coupled to the second and fourth input terminals;
a first current mirror coupled to the first transistor, the first current mirror capable of producing a first current responsive to a voltage on the second and fourth input terminals;
a second current mirror coupled to the second differential input pair of transistors; and
a current source circuit coupled to the first and second current mirrors.

8. The amplifier of claim 7, wherein the current source circuit is capable of providing current to the second current mirror, and an amount of current provided to the second current mirror varies inversely to the first current.

9. The amplifier of claim 7, further including:
a second transistor having a fifth control input and first and second current terminals, the first current terminal coupled to the first differential input pair of transistors, the fifth control input coupled to the cross-over circuit, and the second transistor capable of providing a bias current through the first differential input pair of transistors; and
a clamp circuit coupled to the first current terminal.

10. The amplifier of claim 9, wherein the clamp circuit is capable of causing the second transistor to operate in a saturation region when the first differential input pair of transistors are off.

11. The amplifier of claim 7, further including:
a third differential input pair of transistors having a fifth input terminal, a sixth input terminal, a fifth output terminal, and a sixth output terminal, the fifth input terminal coupled to the first and third input terminals, the sixth input terminal coupled to the second and fourth input terminals, the fifth output terminal coupled to the first and third output terminals, and the sixth output terminal coupled to the second and fourth output terminals.

12. An apparatus, comprising:
a transistor having a control input and first and second current terminals, the second current terminal being an output of the apparatus;
an amplifier having a reference voltage input, a second input coupled to the output of the apparatus, and an amplifier output, the amplifier output capable of providing a signal to the control input, the amplifier comprising:
a first differential input pair of transistors having a first input terminal, a second input terminal, a first output terminal, and a second output terminal;
a second differential input pair of transistors having a third input terminal, a fourth input terminal, a third output terminal, and a fourth output terminal, the first input terminal coupled to the third input terminal and to the reference voltage input, the second input terminal coupled to the fourth input terminal and to the second current terminal; and
a cross-over circuit having a control input coupled to the second and fourth input terminals, the cross-over circuit capable of varying an amount of bias current through the second differential input pair of transistors based on a magnitude of a voltage on the second and fourth input terminals.

13. The apparatus of claim 12, wherein:
the first differential input pair of transistors comprises a pair of NPN bipolar junction transistors; and
the second differential input pair of transistors comprises a pair of natural n-channel field effect transistors.

14. The apparatus of claim 13, further comprising a third differential input pair of transistors comprising a pair of p-channel field effect transistors.

15. The apparatus of claim 12, wherein the cross-over circuit includes:
a first transistor having first control input, the first control input coupled to the second and fourth input terminals;
a first current mirror coupled to the first transistor, the first current mirror capable of producing a first current responsive to a voltage on the second and fourth input terminals;
a second current mirror coupled to the second differential input pair of transistors; and
a current source circuit coupled to the first and second current mirrors.

16. The apparatus of claim 15, wherein the current source circuit is capable of providing current to the second current mirror, and an amount of current provided to the second current mirror varies inversely to the first current.

17. The voltage regulator of claim 15, further including:
a third differential input pair of transistors having a fifth input terminal, a sixth input terminal, a fifth output terminal, and a sixth output terminal, the fifth input terminal coupled to the first and third input terminals, the sixth input terminal coupled to the second and fourth input terminals, the fifth output terminal coupled to the first and third output terminals, and the sixth output terminal coupled to the second and fourth output terminals.

18. The apparatus of claim 17, further including:
a first transistor coupled to the first differential input pair of transistors, the first transistor having a fifth control input and first and second current terminals, and the first transistor capable of providing a bias current through the first differential input pair of transistors; and
a clamp circuit coupled to the fifth control input and to the first current terminal, the clamp circuit capable of causing the first transistor to operate in a saturation region when the first differential input pair of transistors are off.

19. The apparatus of claim 12, wherein the first output terminal is coupled to the third output terminal, and the second output terminal is coupled to the fourth output terminal.

20. The voltage regulator of claim 19, wherein the first output terminal is directly connected to the third output terminal, and the second output terminal is directly connected to the fourth output terminal.

21. An amplifier, comprising:
a first differential input pair of bipolar junction transistors having a first input terminal, a second input terminal, a first output terminal, and a second output terminal;
a second differential input pair of field effect transistors having a third input terminal, a fourth input terminal, a third output terminal, and a fourth output terminal, the first input terminal coupled to the third input terminal, the second input terminal coupled to the fourth input terminal, the first output terminal coupled to the third output terminal, and the second output terminal coupled to the fourth output terminal; and a cross-over circuit having a control input coupled to the second and fourth input terminals, the cross-over circuit capable of varying an amount of bias current through the second differential input pair of field effect transistors based on a magnitude of a voltage on the second and fourth input terminals.

22. The amplifier of claim 21, wherein the cross-over circuit includes:

a first transistor having first control input, the first control input coupled to the second and fourth input terminals;

a first current mirror coupled to the first transistor, the first current mirror capable of producing a first current responsive to a voltage on the second and fourth input terminals;

a second current mirror coupled to the second differential input pair of transistors; and a current source circuit coupled to the first and second current mirrors.

23. The amplifier of claim 22, further comprising:

a third differential input pair of field effect transistors having a fifth input terminal, a sixth input terminal, a fifth output terminal, and a sixth output terminal, the fifth input terminal coupled to the first and third input terminals, the sixth input terminal coupled to the second and fourth input terminals, the fifth output terminal coupled to the first and third output terminals, and the sixth output terminal coupled to the second and fourth output terminals.

24. The amplifier of claim 23, further including:

a second transistor having a fifth control input and first and second current terminals, the first current terminal coupled to the first differential input pair of bipolar junction transistors, the fifth control input coupled to the cross-over circuit, and the second transistor capable of providing a bias current through the first differential input pair of bipolar junction transistors; and a clamp circuit coupled to the first current terminal, the clamp circuit is capable of causing the first transistor to operate in a saturation region when the first differential input pair of bipolar junction transistors are off.

25. The amplifier of claim 24, wherein the circuit is capable of varying the amount of bias current through the second differential input pair of field effect transistors in an inverse relationship to the magnitude of a voltage on the second and fourth input terminals.

* * * * *